(12) United States Patent
Nishioka

(10) Patent No.: US 6,733,148 B2
(45) Date of Patent: May 11, 2004

(54) SPREAD ILLUMINATING APPARATUS WITH FLEXIBLE PRINTED CIRCUIT

(75) Inventor: Akihisa Nishioka, Iwata-gun (JP)

(73) Assignee: Minebea Co., Ltd., Kitasaku-gun (JP)

( * ) Notice: Subject to any disclaimer, the term of this patent is extended or adjusted under 35 U.S.C. 154(b) by 0 days.

(21) Appl. No.: 10/230,332

(22) Filed: Aug. 29, 2002

(65) Prior Publication Data

US 2003/0043570 A1 Mar. 6, 2003

(30) Foreign Application Priority Data

Sep. 4, 2001 (JP) ........................................ 2001-267331

(51) Int. Cl.[7] .............................................. G01D 11/28
(52) U.S. Cl. ............................ 362/26; 362/31; 362/327
(58) Field of Search .............................. 362/26, 31, 330, 362/327

(56) References Cited

U.S. PATENT DOCUMENTS 6,601,963 B2 * 8/2003 Suzuki et al. .................. 362/31

* cited by examiner

Primary Examiner—Sandra O'Shea
Assistant Examiner—Ali Alavi
(74) Attorney, Agent, or Firm—Oliff & Berridge, PLC

(57) ABSTRACT

Land portions to which the spot-like light source is soldered are provided at the end of the FPC, whereby the light emitting surface of the spot-like light source is aligned to the side of the FPC, that is, the FPC does not protrude from the light emitting surface. The spot-like light source mounted on the FPC is disposed close to the light conductive bar with its light emitting surface facing the end surface of the light conductive bar. Since the FPC does not exist ahead of the light emitting surface, the FPC does not overlap the end portion of the light conductive bar, so that light rays emitted from the light emitting surface do not irradiate the FPC.

5 Claims, 6 Drawing Sheets

SPREAD ILLUMINATING APPARATUS WITH FLEXIBLE PRINTED CIRCUIT

BACKGROUND OF THE INVENTION

1. Field of the Invention

The present invention relates to a spread illuminating apparatus, and more particularly to a spread illuminating apparatus used as an illuminating means for a liquid crystal display device.

2. Description of the Related Art

A liquid crystal display (hereinafter referred to as "LCD") which is low in profile, small in occupied volume, and lightweight has been extensively used in electric products including personal computers and cellular phones, and the demand therefor has been increasing. However, since a liquid crystal used for the LCD does not emit light by itself, it is necessary to provide a separate illuminating apparatus besides the LCD in order to irradiate a liquid crystal when the LCD is used in dark places where sunlight or room light is not fully available. Thus, the illuminating apparatus for irradiating the liquid crystal is desired to be compact and small in power consumption, and a low profile spread illuminating apparatus of side light type (light conductive plate type) is often used recently.

FIG. 4 is an exploded perspective view showing a conventional spread illuminating apparatus 1' of side light type in which a spot-like light source is mounted on a flexible printed circuit (hereinafter, referred to as "FPC").

As shown in the figure, the spread illuminating apparatus 1' generally comprises a light conducive plate 2 made of a light-transmissible material, lamps 5a and 5b comprising light conductive bars 3a and 3b and spot-like light sources 4a and 4b, respectively, and arranged respectively along end surfaces 8 and 18 of the light conductive plate 2, an FPC 6 on which the spot-like light sources 4a and 4b are mounted, and light reflection members (lamp frames) 13a and 13b covering the lamps 5a and 5b. Light rays emitted from the lamps 5a and 5b and introduced into the light conductive plate 2 are reflected therein so as to irradiate an LCD (not shown) disposed under the light conductive plate 2.

The light conductive plate 2 has a light reflection pattern 29 on a top surface (observation-side surface) 25 thereof so as to uniformly spread the light rays introduced thereinto through the end surfaces 8 and 18 toward the LCD entirely through a bottom surface 26. The light reflection pattern 29 comprises a plurality of grooves 27 and a plurality of flat portions 28 each present between adjacent grooves, and is oriented parallel to the length direction of the light conductive bars 3a and 3b. Alternatively, the light reflection pattern 29 may comprise only grooves continuously arrayed, and the grooves do not have to be parallel with the length direction of the light conductive bars 3a and 3b but may be oriented to have a predetermined angle thereto. With the light reflection pattern thus constructed, the light rays having entered the light conductive plate 2 are substantially uniformly reflected at the whole top surface of the light conductive plate 2 thereby uniformly irradiating the LCD disposed under the light conductive plate 2.

As above described, the lamps 5a and 5b are composed of the light conductive bars 3a and 3b and the spot-like light sources 4a and 4b (for example, light-emitting diodes), respectively. The light conductive bars 3a and 3b have optical path conversion means 12a and 12b, respectively, formed on one side surface thereof opposite to a side surface facing the light conductive plate, and have the spot-like light sources 4a and 4b, respectively, disposed close to an end surface thereof. The spot-like light sources 4a and 4b are mounted by soldering at land portions formed on the FPC 6. The land portions are electrically connected to a power source pattern (not shown) formed on the FPC 6, and power is supplied to the land portions from a connect section 6a of the FPC 6 via the power source pattern.

The lamp frames 13a and 13b are provided so as to cover the lamps 5a and 5b, respectively, thereby allowing light rays emitted from the spot-like light sources 4a and 4b to efficiently enter the light conductive plate 2, preventing the light conductive bars 3a and 3b from being damaged by contact with any other members, and making the light conductive bars 3a and 3b further dustproof. The lamp frames 13a and 13b are shaped substantially like U-letter, and cover respective longitudinal surfaces of the light conductive bars 3a and 3b except respective surfaces facing the light conductive plate 2, and cover also both end portions of the light conductive plate 2. The lamp frames 13a and 13b are each formed of a hard resin member, on inner surface of which a film with a metal such as silver vapor-deposited or a white film is adhered or formed of a bent metal sheet such as an aluminum sheet, a stainless steel sheet, or the like.

FIG. 5 is a schematic view showing how light rays emitted from a spot-like light source are guided into a light conductive plate.

The light rays radially emitted from the spot-like light source 4 are reflected and refracted at four side surfaces of the light conductive bar 3 substantially rectangular in section or by the lamp frame 13 covering the longitudinal surfaces of the light conductive bar 3, and most of the light rays are guided to the light conductive plate. More specifically, as shown in the figure, some light elements 7a and 7b enter the light conductive bar 3 through the end surface thereof, and are confined therein due to a difference in the refractive index between the light conductive bar 3 and the atmosphere. Then, the light elements 7a and 7b are guided into the light conductive plate 2 after being reflected and refracted at grooves 14 of an optical path conversion means. But, some light elements such as an element 7c do not enter the light conductive bar 3, and directly enter the light conductive plate 2. This occurs if members are not appropriately assembled, specifically, if there is too much space between the spot-like light source 4 and the end surface of the light conductive bar 3. When this occurs, a linear bright line appears on a screen.

Another factor for generating a bright line on the screen will be described with reference to FIG. 6. In the figure, the members making up the spread illuminating apparatus are correctly and accurately positioned and assembled. In such a state, when the light conductive plate 2 is observed from a left-to-right direction (a direction parallel to the grooves 27 of the light reflection pattern 29 formed on the light conductive plate 2), a zonal bright line indicated by a reference numeral 7d, so-called reflected bright line, appears on an end surface 15 of the light conductive bar 3 due to reflection at the grooves 27 and reflection at the bottom surface of the light conductive plate 2 (Fresnel reflection).

The spot-like light sources 4a and 4b need to be arranged right in font of and close to the end surfaces of the light conductive bars 3a and 3b, respectively, in order to allow light rays to efficiently enter the light conductive bars 3a and 3b. According to the prior art shown in FIG. 4, the spot-like light sources 4a and 4b are mounted on the FPC 6 as shown in FIG. 7. Accordingly, when the spot-like light sources 4a and 4b are disposed close to respective end surfaces of the light conducive members 3a and 3b, parts of the FPC 6 (shaded area) are located under the end portions (bottom side) of the light conductive bars 3a and 3b as shown in FIG. 8. In this case, since the FPC 6 has, for example, a yellow color, an orange color, or the like, when light rays radially emitted from the spot-like light sources 4a and 4b are partly reflected at the FPC 6 and enter the light conductive plate 2, a bright line of the color of the FPC 6 appears on the screen due to the reflected light rays. This phenomenon is conspicuous, in particular, when the members are not correctly positioned to be assembled thereby generating the linear bright line on the screen, or when the zonal reflected bright line appears, as described above.

SUMMARY OF THE INVENTION

The present invention has been made in light of the above problems. Accordingly, it is an object of the present invention to provide a spread illuminating apparatus which is fire from the bright line of the color of the FPC appearing on a screen.

In order to achieve the above object, a spread illuminating apparatus according to the present invention comprises: a light conductive plate made of a light-transmissible material; at least one lamp including a light conductive bar disposed close to and along an end surface of the light conductive plate and at least one spot-like light source arranged at an end surface of the light conductive bar; and an FPC having the spot-like light source mounted at land portions thereof, the land portions being positioned such that the FPC does not exist ahead of a light emitting surface of said spot-like light source mounted.

According to the configuration of the present invention, light rays emitted radially from the light emitting surface of the spot-like light source does not irradiate the FPC and therefore light rays of the FPC color do not enter the light conductive bar.

In order to achieve the above object, in the spread illuminating apparatus according to the present invention, preferably, the FPC having the spot-like light source mounted thereon does not overlap any part of a top surface or a bottom surface of the light conductive bar when the spot-like light source is set in place at the end surface of the light conductive bar.

According to the configuration of the present invention, light rays having entered the light conductive bar do not irradiate the FPC and light rays of the color of the FPC color do not enter the light conductive plate.

DESCRIPTION OF THE PREFERRED EMBODIMENTS

Figure 1:
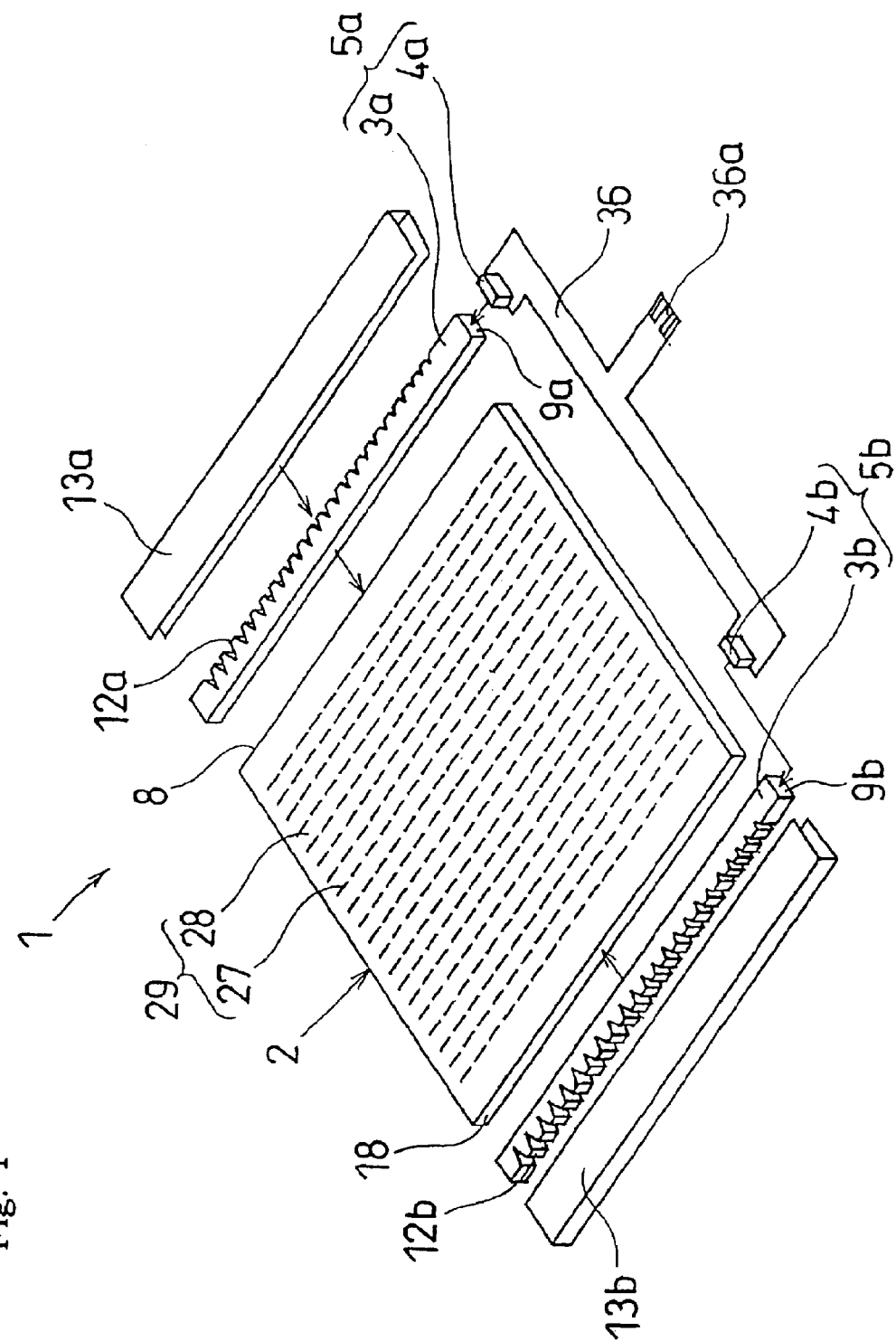
FIG. 1 is an exploded perspective view showing an embodiment of a spread illuminating apparatus according to the present invention.

Embodiments of a spread illuminating apparatus according to the present invention will be described with reference to FIGS. 1 to 3B. The spread illuminating apparatus is characterized by an FPC on which spot-like light sources are mounted, in particular, by the position of the spot-like light sources on the FPC. Since the other component members can be the same as those of a conventional spread illuminating apparatus 1', the same members are denoted by the same reference numerals and a detailed description thereof will be omitted as appropriate.

Referring to FIG. 1, a spread illuminating apparatus 1 according to the present invention generally comprises: a light conductive plate 2; lamps 5a and 5b including respectively light conductive bars 3a and 3b arranged along respective end surfaces 8 and 18 of the light conductive plate 2, and spot-like light sources 4a and 4b (for example, LEDs) disposed to face respective end surfaces 9a and 9b of the light conductive bars 3a and 3b; an FPC 36 on which the spot-like light sources 4a and 4b are mounted; and light reflection members (amp frames) 13a and 13b which cover the lamps 5a and 5b, respectively, and is used as an auxiliary illuminating means for an LCD (not shown) disposed under the light conductive plate 2.

The spot-like light sources 4a and 4b are, for example, rectangular in section and are mounted by soldering on the FPC 36 made of an insulating material. The FPC 36 is provided with land portions 32 (see FIG. 3A) to which the spot-like light sources 4a and 4b are soldered. The land portions 32 are electrically connected to a power source pattern (not shown) formed on the FPC 36, and power is supplied from a connecting section 36a of the FPC 36 to the spot-like light sources 4a and 4b via the power source pattern.

Figure 2:
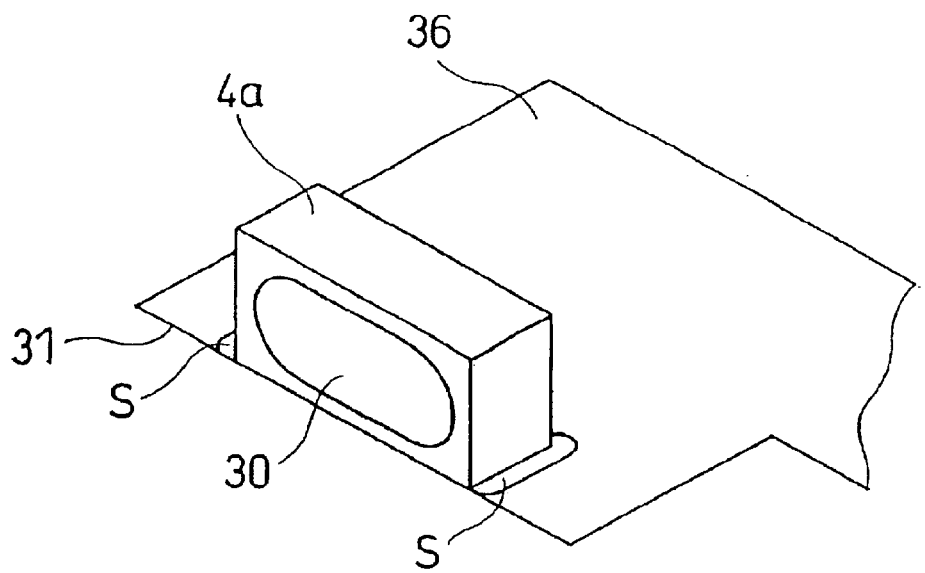
FIG. 2 is a perspective view of a spot-like light source mounted on an FPC of FIG. 1.

Referring to FIG. 2, the spot-like light source 4a is mounted by soldering at an end portion (soldering portion S) of the FPC 36 such that a light emitting surface 30 is aligned to a side 31 of the FPC 36.

Figure 3A:
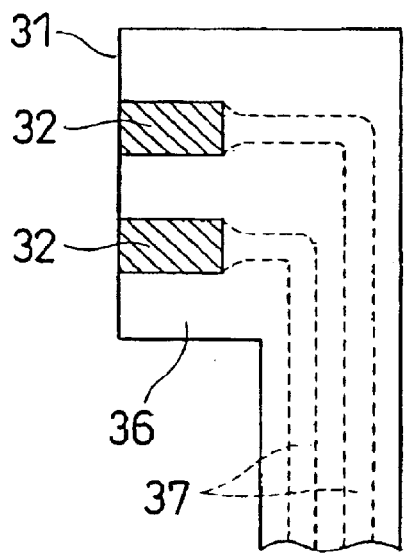
FIG. 3A is a view of land portions on the FPC of FIG. 1, to which the spot-like light source is soldered.
Figure 9:
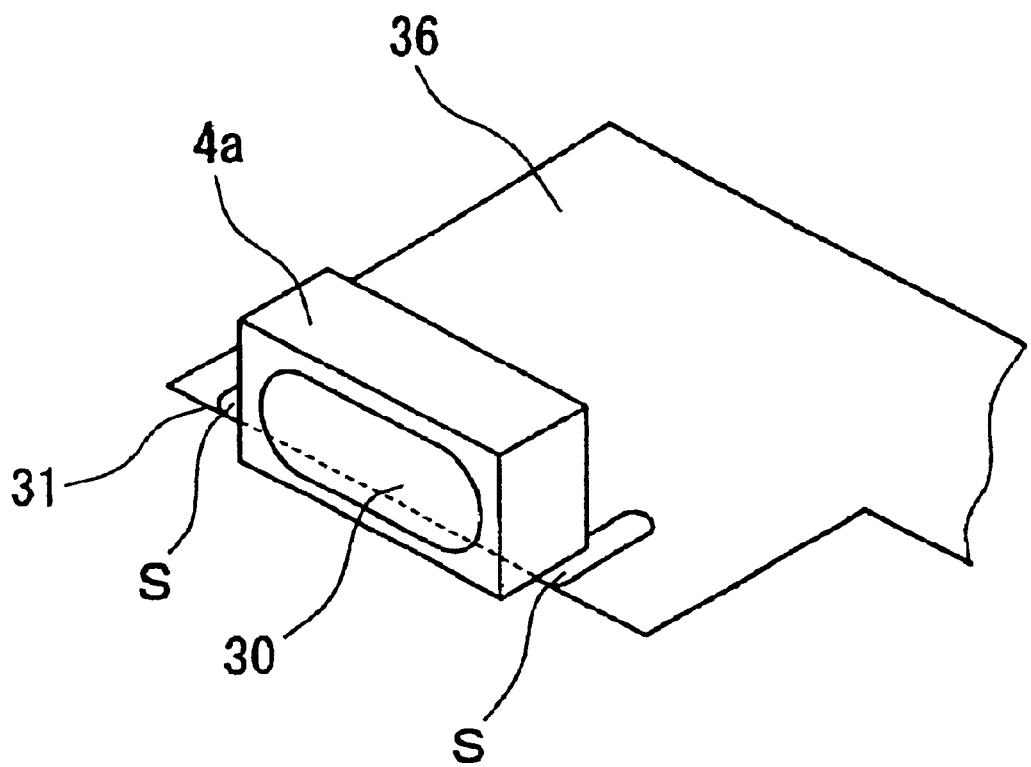
FIG. 9 is a perspective view of another embodiment of a spot-like light source mounted on an FPC.

Referring to FIG. 3A, the land portions 32 are provided at the end portion of the FPC 36. The number of the land portions 32 is equal to the number of terminals of the spot-like light source 4a (two in this embodiment). Since the land portions 32 are provided at the end portion of the FPC 36 so as to make the light emitting surface 30 of the spot-like light source 4a aligned to the side 31 of the FPC 36, any portion of the FPC 36 does not protrude from the light emitting surface 30 (refer to FIG. 3B). Of course, the light emitting surface 30 of the spot-like light source 4a may protrude from the side 31 of the FPC 36 as shown in FIG. 9.

In this connection, dotted lines 37 in FIG. 3A show a power source pattern for supplying power to the land portions 32, that is, to the spot-like light source 4a.

The land portions 32 are formed so as to end up to the side 31 of the FPC 36 in the embodiment shown in FIG. 3A, but the present invention is not limited thereto. The land portions 32 may be arbitrarily sized and positioned as long as the emitting surface 30 of the spot-like light source 4a is surely aligned to the side 31 of the FPC 36.

Figure 3B:
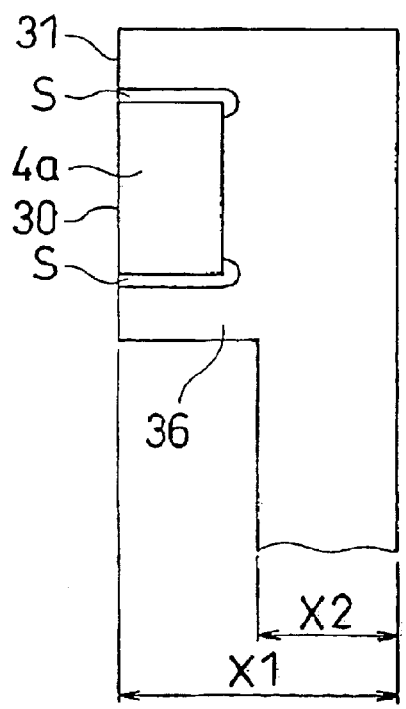
FIG. 3B is a top view of the spot-like light source soldered to the land portions of FIG. 3A.
Figure 4:
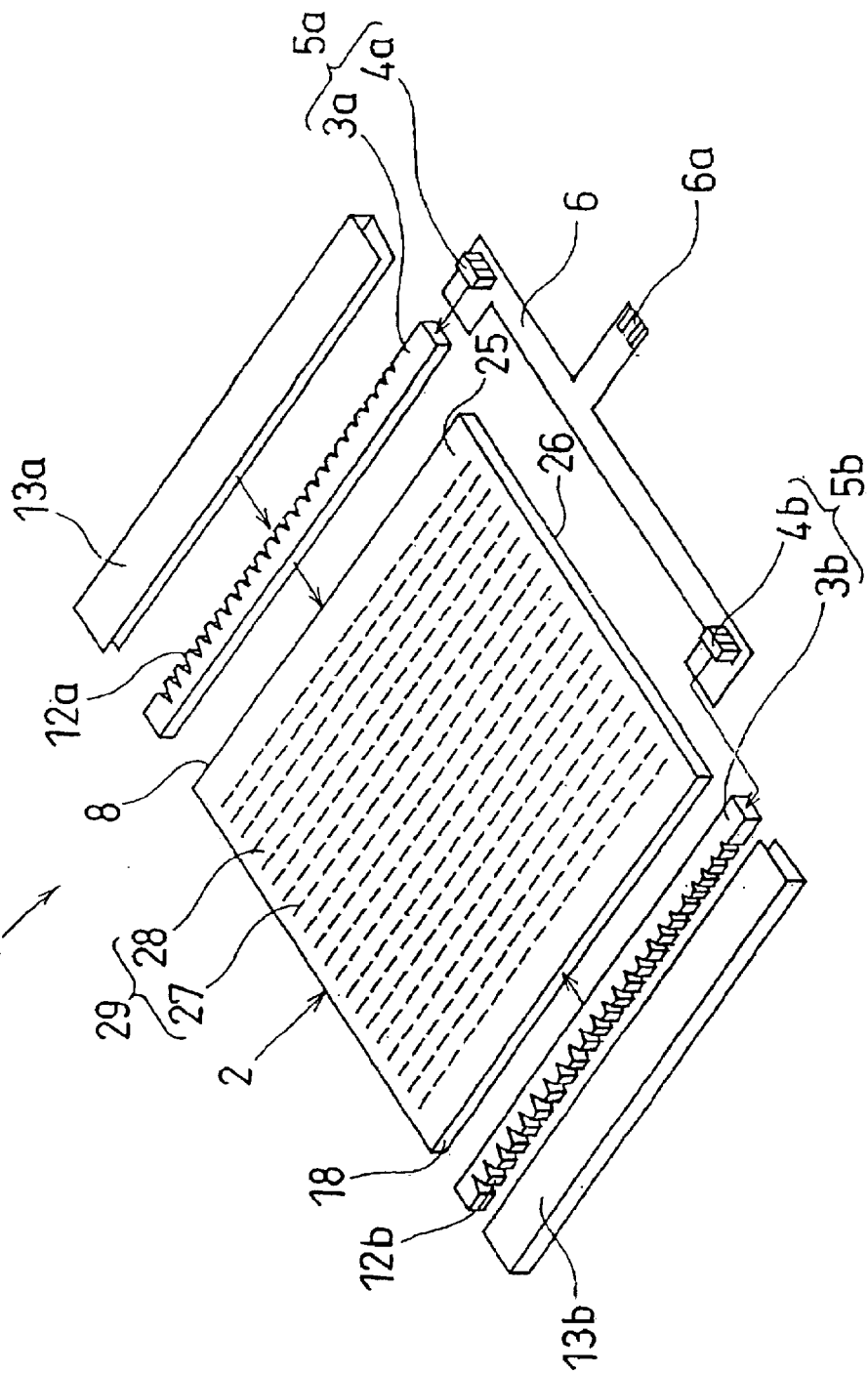
FIG. 4 is an exploded perspective view of an example of a conventional spread illuminating apparatus.
Figure 5:
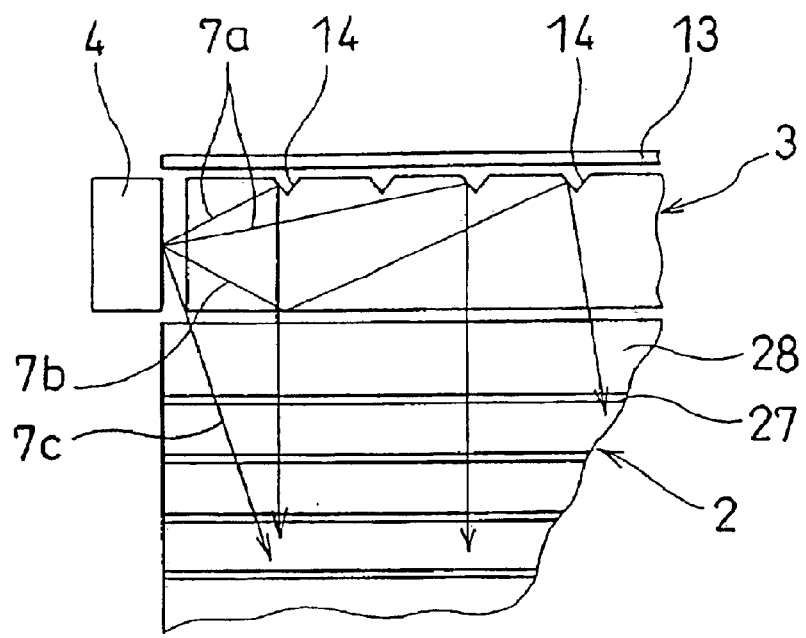
FIG. 5 is a schematic view showing how light rays emitted from a spot-like light source enter a light conductive plate.
Figure 6:
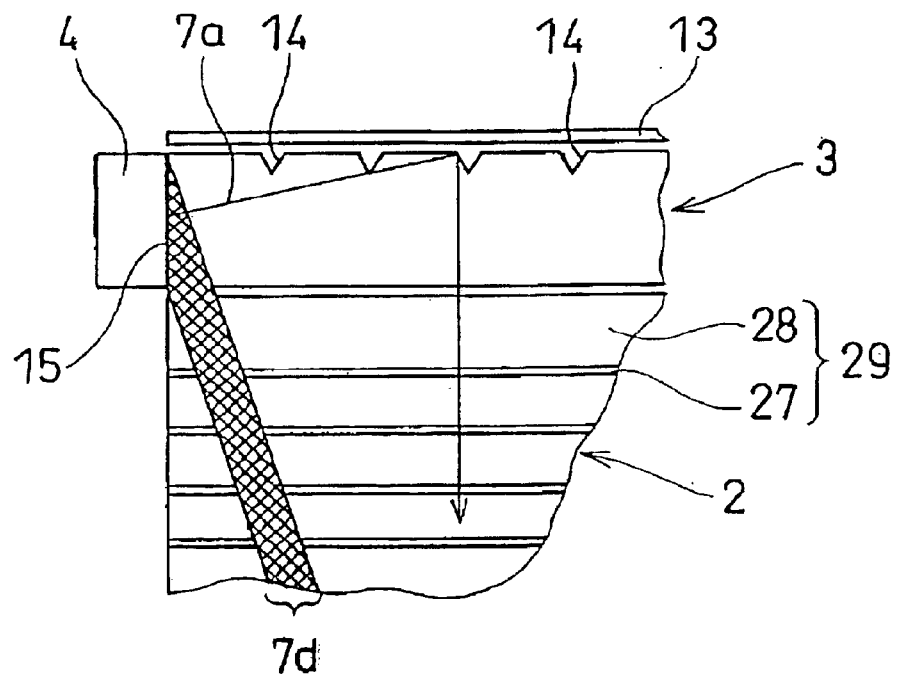
FIG. 6 is a view for explaining a bright line appearing on a screen.
Figure 7:
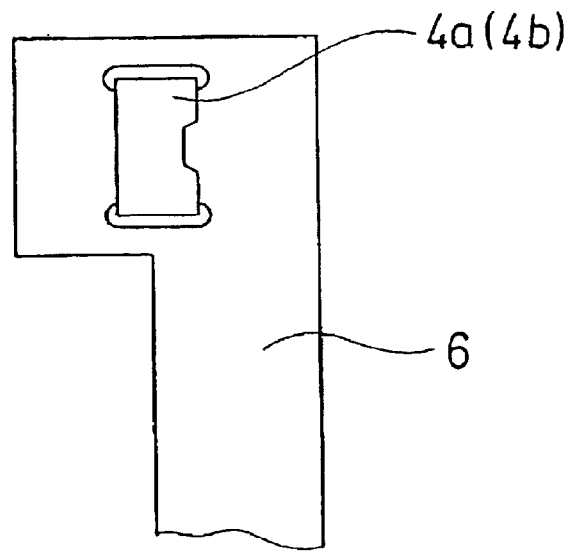
FIG. 7 is a view of a spot-like light source mounted on an FPC in the conventional spread illuminating apparatus.
Figure 8:
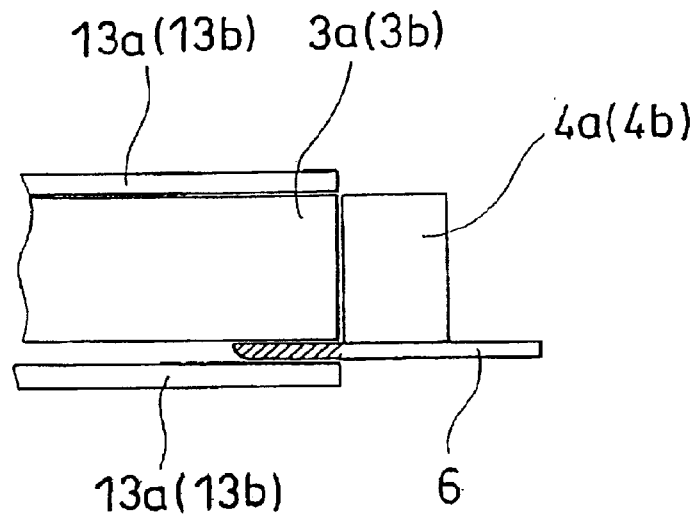
FIG. 8 is a view showing how a part of the FPC is disposed under an end of a light conductive bar in the conventional spread illuminating apparatus.

The spot-like light source 4a mounted on the FPC is disposed such that the light emitting surface 30 thereof closely faces the end surface 9a of the light conductive bar 3a. In this case, since the FPC 36 does not exist ahead of the light emitting surface 30 of the spot-like light source 4a (on the left side in FIG. 3B), as shown in FIGS. 2, 3B and 9, the FPC 36 does not get under the end portion of the light conductive bar 3a, whereby light rays emitted from the light emitting surface 30 of the spot-like light source 4a do not irradiate the FPC 36.

Also, the FPC 36 is shaped to have different widths X1 and X2 (refer to FIG. 3B) in this embodiment, but may alternatively be shaped to have a constant width, or otherwise, as long as the FPC does not exist between the light emitting surface of the spot-like light source and the light conductive bar, or under the light conductive bar when the spot-like light source mounted on the FPC is set in place with its light emitting surface closely facing the end surface of the light conductive bar. The FPC may be disposed above the spot-like light source without existing above the light conductive bar.

The spread illuminating apparatus 1 does not have to be configured as shown in FIG. 1, but may be configured such that the only one lamp comprising a light conductive bar and a spot-like light source is disposed along one end surface of the light conductive plate, or that two spot-like light sources are disposed respectively at both ends of a light conductive bar as long as each of the spot-like light sources mounted on the FPC is arranged to face the end of the light conductive bar.

According to the first aspect of the present invention, since any of the land portions do not exist ahead of the light emitting surface of the spot-like light source mounted on the FPC, the light rays emitted from the spot-like light source mounted are not reflected by the FPC thereby eliminating the bright line of the FPC color on the screen.

Also, according to the second aspect of the present invention, even if the light emitting surface of the spot-like light source mounted on the FPC is set in place to closely face the end surface of the light conductive bar, the FPC does not overlap a top surface or a bottom surface of the light conductive bar, so that light rays emitted from the spot-like light source and having entered the light conductive bar do not irradiate the FPC, thereby eliminating the bright line of the FPC color appearing on the screen.

What is claimed is:

1. A spread illuminating apparatus comprising:
   a light conductive plate made of a light-transmissible material;
   at least one lamp including a light conductive bar disposed close to and along an end surface of said light conductive plate and at least one spot-like light source arranged at an end surface of said light conductive bar in which said at least one spot-like light source is rectangular in section and has a light emitting surface perpendicular to a flexible printed circuit and facing to the end surface of said light conductive plate,
   wherein said flexible printed circuit has said at least one spot-like light source mounted at land portions thereof and does not protrude ahead of said light emitting surface of said spot-like light source.

2. A spread illuminating apparatus as claimed in claim 1, wherein
   said flexible printed circuit having said at least one spot-like light source mounted thereon does not overlap one of a top surface and a bottom surface of said light conductive bar when said spot-like light source is set in place at said end surface of said light conductive bar.

3. A spread illuminating apparatus comprising:
   a light conductive plate having a light incident surface;
   a flexible printed circuit having land portions that extend to a first edge of the flexible printed circuit;
   at least one lamp including
      a light conductive bar having a first end and a second surface that faces the light incident surface,
      at least one spot-like light source having a light emitting surface facing the first end of the light conductive bar, the at least one spot-like light source being mounted over the land portions of the flexible printed circuit so that the light-emitting surface is either aligned flush with the first edge of the flexible printed circuit or extends over the first edge of the flexible printed circuit.

4. The spread illuminating apparatus according to claim 3, wherein the flexible printed circuit having said at least one spot-like light source mounted thereon does not overlap one of a top surface and a bottom surface of the light conductive bar when the spot-like light source is set in place at the first end of the light conductive bar.

5. The spread illuminating apparatus according to claim 3, wherein the at least one spot-like light source has a rectangular shaped housing and the housing has only one side that is attached to the flexible printed circuit.

* * * * *